(12) United States Patent
Starikov et al.

(10) Patent No.: US 7,381,966 B2
(45) Date of Patent: Jun. 3, 2008

(54) SINGLE-CHIP MONOLITHIC DUAL-BAND VISIBLE- OR SOLAR-BLIND PHOTODETECTOR

(75) Inventors: David Starikov, Houston, TX (US); Abdelhak Bensaoula, Houston, TX (US)

(73) Assignee: Integrated Micro Sensors, Inc., Houston, TX (US)

( * ) Notice: Subject to any disclaimer, the term of this patent is extended or adjusted under 35 U.S.C. 154(b) by 0 days.

(21) Appl. No.: 11/403,691

(22) Filed: Apr. 13, 2006

(65) Prior Publication Data

US 2007/0241279 A1    Oct. 18, 2007

(51) Int. Cl.
*G01J 1/42* (2006.01)
(52) U.S. Cl. ............... 250/372; 250/339.01; 250/338.4
(58) Field of Classification Search ................ 250/372, 250/339.01, 338.4
See application file for complete search history.

(56) References Cited

U.S. PATENT DOCUMENTS

| H0101 H | * | 8/1986 | Walker ................... 250/338.1 |
| 5,726,440 A | * | 3/1998 | Kalkhoran et al. ...... 250/214.1 |
| 6,049,116 A | | 4/2000 | Park et al. |
| 6,897,447 B2 | | 5/2005 | Mitra |
| 2004/0188617 A1 | * | 9/2004 | Devitt et al. ............. 250/338.1 |

OTHER PUBLICATIONS

D. Starikov, C. Boney, R. Pillai, and A. Bensaoula, Proceedings the ISA/EEE Sensors for Industry Conference 2004, New Orleans, LA, 2004 (IEEE, Piscataway, NJ, 2004), pp. 36-40.*
Ryzhii, Victor, "Heterostructure Device," Wiley Encyclopedia of Electrical and Electronics Engineering, John Wiley & Sons, Inc. Article Online Posting Date: Dec. 27, 1999.*
Balasubramanian, Balagurunathan, et al., "Call Center Dashboard," Filing Date—Oct. 7, 2004, U.S. Appl. No. 10/960,535, Specification (42 pgs.) and Drawings (13 sheets).
Himawan, Rudi, et al., "Single Sign-On System and Method," Filing Date—Nov. 22, 2004, U.S. Appl. No. 10/994,997, Specification (33 pgs.) and Drawings (3 sheets).
Sarath Gunapala; Megapixel QWIPs Deliver Multi-Color Performance, Compoundsemiconductor.net, Oct. 2005.
Solar Blind, Science Update, Science NetLinks at www.sciencenetlinks.org, 2002.
Solar Blind Detectors (SBD), Microsystems Technology Office at www.darpa.mil/MTO/sbd/index.html, no date.
Chan, Goldberg, Der and Nasrabadi; Dual-band imaging improves detection of military targets, OE Magazine, The SPIE Magazine, Apr. 2002.
Absolute XUV Silicon Photodiodes; International Radiation Detectors Inc., at www.ird-inc.com, no date.
Eden Prairie; Superior Vacuum Technology Associates, NASA SBIR Success at www.sbir.gsfc.nasa.gov, no date.
Michael D. Wheeler; Inverted Structure Yields Solar-Blind UV Detector, Applied Physics Letters, Jul. 2000 at www.photonics.com.
Tut, Biyikli, Kimukin, Kartaloglu, Aytur, Unlu and Ozbay; High bandwidth-efficienty solar-blind AlGaN Schottky photodiodes, Jul. 2004, www.sciencedirect.com.

* cited by examiner

*Primary Examiner*—Constantine Hannaher
*Assistant Examiner*—Jessica L Eley
(74) *Attorney, Agent, or Firm*—Claude E. Cooke, Jr.; Burleson Cooke L.L.P.

(57) ABSTRACT

A photodetector having sensitivity in both an infrared and an ultraviolet band is provided. The photodetector is formed on a single chip and is designed to be blind to solar or visible radiation. Structures disclosed allow fast and efficient detection of signals with high spatial and temporal resolution. Such sensors may be used for multi-pixel focal arrays and applied for fire detection applications, various space- and military-related applications and other applications.

8 Claims, 6 Drawing Sheets

SINGLE-CHIP MONOLITHIC DUAL-BAND VISIBLE- OR SOLAR-BLIND PHOTODETECTOR

BACKGROUND OF THE INVENTION

1. Field of the Invention

The present invention relates to photodetectors with resolved sensitivities in the UV and IR bands. Method for fabrication of the photodetectors is also provided.

2. Description of Related Art

Solid-state optical detectors based on semiconductor materials have replaced photoemissive devices in a wide variety of both commercial and military applications due to their broad spectral responsivity, excellent linearity, high quantum efficiency, high dynamic range of operation, and possibility of large-format image arrays. The spectral range of most semiconductor-based optical detectors is determined by optical absorption in the active semiconductor material layer at energies above the semiconductor band gap, the cutoff wavelength. In such terms narrow-band gap semiconductors, such as II-VI compounds like HgCdTe, are suitable for infrared detection, Si and some III-V compounds are suitable for detection in the visible and near infrared range, and wide band gap semiconductor materials, such as diamond, SiC, and III-Nitrides, are superior for applications in the UV range.

Several military and industrial applications require simultaneous (or at least spatially synchronized) detection of optical emissions in different spectral regions. A large number of various objects, such as, for example, fires, jet or rocket nozzles, hot filaments, stellar luminaries, electrical arcs, and lightning produce optical emissions ranging from ultraviolet to IR. Such emissions can be detected over the wide-range of ambient light background only by fast multi-range optical detectors allowing time-resolved measurements in particular optical bands. As a result, not only the spectral range, but also the detector speed and spatial resolution and alignment become critical for fast fire-detection with high false-alarm immunity. The currently used photomultiplier tubes (PMTs) have high sensitivity, but are bulky, require high voltage operation, and have low mechanical and temperature strength. Some recently developed flame detectors are composed of discrete UV and IR solid-state components in one housing, sustain temperatures only up to 125° C., and are not capable of detecting multi-band optical signals with high spatial resolution.

To date significant progress has been made in the development of UV detectors based on wide band gap materials. Several attempts to develop UV detector structures on diamond were made by 1996, but lack of high quality layers and insufficient doping levels did not result in practical devices. Visible-blind UV photodetectors have been fabricated on silicon carbide (SiC) substrates, but the technology is relatively immature due to the absence of high quality large area substrates until recent years.

Group III-nitride materials are superior for advanced UV detector fabrication due to their wider direct band gap and high thermal, chemical, mechanical, and radiation tolerance. A large amount of research by several groups has been dedicated to the development of UV detectors based on GaN, GaN/AlGaN, and AlGaN. Currently attracting most interest are AlGaN-based structures since they can provide detection in the very important UV range of 240-280 nm, which corresponds to the optical window where solar radiation is significantly absorbed by the ozone layer. Research and development performed by several groups indicate that effective optical emission and detection can be achieved in a wide spectral band ranging from 200 to 1770 nm. This would allow integrated nitride only-based devices working in separate bands (including UV and IR) from the entire referenced range.

In the area of IR detection, the conventional HgCdTe- and InSb-based detectors display high quantum efficiencies but are difficult to integrate into large arrays. Detectors based on heterointernal photoemission (HIP) in $Ge_xSi_{1-x}/Si$ heterojunctions have demonstrated excellent opportunities for integration on Si wafers at sufficient sensitivities in the infrared range of 1-12 µm. Large area SiGe-based HIP photodetector arrays of 400×400 pixels have been available for close to ten years. Schottky barrier photodetectors based on metal suicides formed on silicon also allow extending the sensitivity to the longer IR (>than 1.1 µm) range.

The Radio Frequency Molecular Beam Epitaxy (RF MBE) method used for nitride material growth allows fabrication of multilayer structures that incorporate binary, ternary, or even quaternary nitride compounds with a precise control over the layer thickness, chemical composition, crystalline quality, and doping during a single-process growth on commercial sapphire or silicon substrates. Growth of III nitrides on Si wafers takes advantage of both the commercial and technological benefits offered by the well-commercialized silicon technology and the existing low cost electronic and optical IR devices. Device-quality GaN layers grown on silicon wafers have been demonstrated by several groups. Additional benefits for employment of silicon in the present invention come from its optical properties providing the ability to detect and block optical emissions in the near IR and visible ranges, respectively.

A multi-spectral infrared photodetector and imager is disclosed in U.S. Pat. No. 6,897,447 B2. Two or more different bands of IR radiation are detected by a diffractive resonant optical cavity. U.S. Pat. No. 6,049,116 also teaches a device and fabrication method for a two-color IR detector What is needed is a miniature, chip-based dual-color high-temperature visible- or solar-blind photodetector that will allow for fast and efficient detection of optical emission in UV and IR bands using sensors in close proximity, so as to produce high spatial- and temporal-resolution signals. Such sensors should allow fabrication of multi-pixel focal arrays for dual-band visible- or solar-blind cameras, which can be used not only for fire/flame detection and imaging, but also for various space- and military-related applications that involve object/target recognition.

SUMMARY OF INVENTION

This invention describes a monolithic single-chip dual-band photodetector with resolved sensitivities in UV and IR bands. The active semiconductor layers used as UV and IR detectors may be stacked or interlaced. Stacked layers may be formed using standard methods of fabrication. A method for fabrication of interlaced semiconductor layers is disclosed herein. The structure may be interlaced on the same surface of a substrate that is opaque to visible or solar radiation. A layer that is opaque to visible or solar radiation (or both) may be provided in the stacked embodiment, or if an opaque substrate is used, this opaque layer may be omitted. In one embodiment, a silicon substrate serves as a layer for the IR detector structure fabrication, a filter for blocking visible or solar radiation and a compatible substrate for growth of III nitride layers for UV sensitivity. In a second embodiment, a silicon-on-sapphire (SOS) substrate is used and the silicon layer grown on top of sapphire is used for IR photodetector fabrication, blocking visible radiation, and III nitride layer growth. The sapphire substrate in the second embodiment serves as a compatible substrate for the growth of the III nitride layers used in UV detector fabrication and an optically transparent window.

DETAILED DESCRIPTION

The device disclosed herein meets the following basic requirements:

1) two photosensitive structures are stacked on a single substrate in one embodiment and are interlaced in another embodiment to form a monolithic photodetector;

2) one structure is sensitive to radiation in a UV band and the second structure is sensitive to radiation in an IR band;

3) the monolithic photodetector is insensitive to solar or visible radiation;

4) the monolithic photodetector is capable of time- and electrically-resolved detection of both UV and IR radiation in the same space register;

5) the two active semiconductor layers and contacts used as photosensitive structures as well as the passive semiconductor layer used to filter out the visible or solar radiation, are stacked on a single substrate in one embodiment;

6) the photosensitive structures are either diodes (Schottky, p-n, p-i-n, multi-quantum well junctions) or photoresistors formed by deposition of contacts on active semiconductor layers; and 7) the device can have additional layers also stacked on the substrate that are necessary for the growth of the semiconductor layers (for example buffer layers) or to provide electrical isolation between other layers (for example silicon dioxide). These additional layers have negligible effect on the optical transmission of the whole stacked monolithic device structure.

Definitions:

1. A substrate is a wafer suitable for the growth and deposition of active and passive semiconductor and contact layers. A substrate can be also transparent to IR radiation and can be opaque to visible radiation.

2. Active semiconductor layers are layers of semiconducting materials that are used for fabrication of UV- and IR-sensitive structures.

3. UV- and IR-sensitive structures are fabricated by using active semiconductor layers and contacts.

4. Passive semiconductor layers are layers opaque to visible or solar radiation that can be deposited on the substrate or be a part of the substrate.

Figure 1:
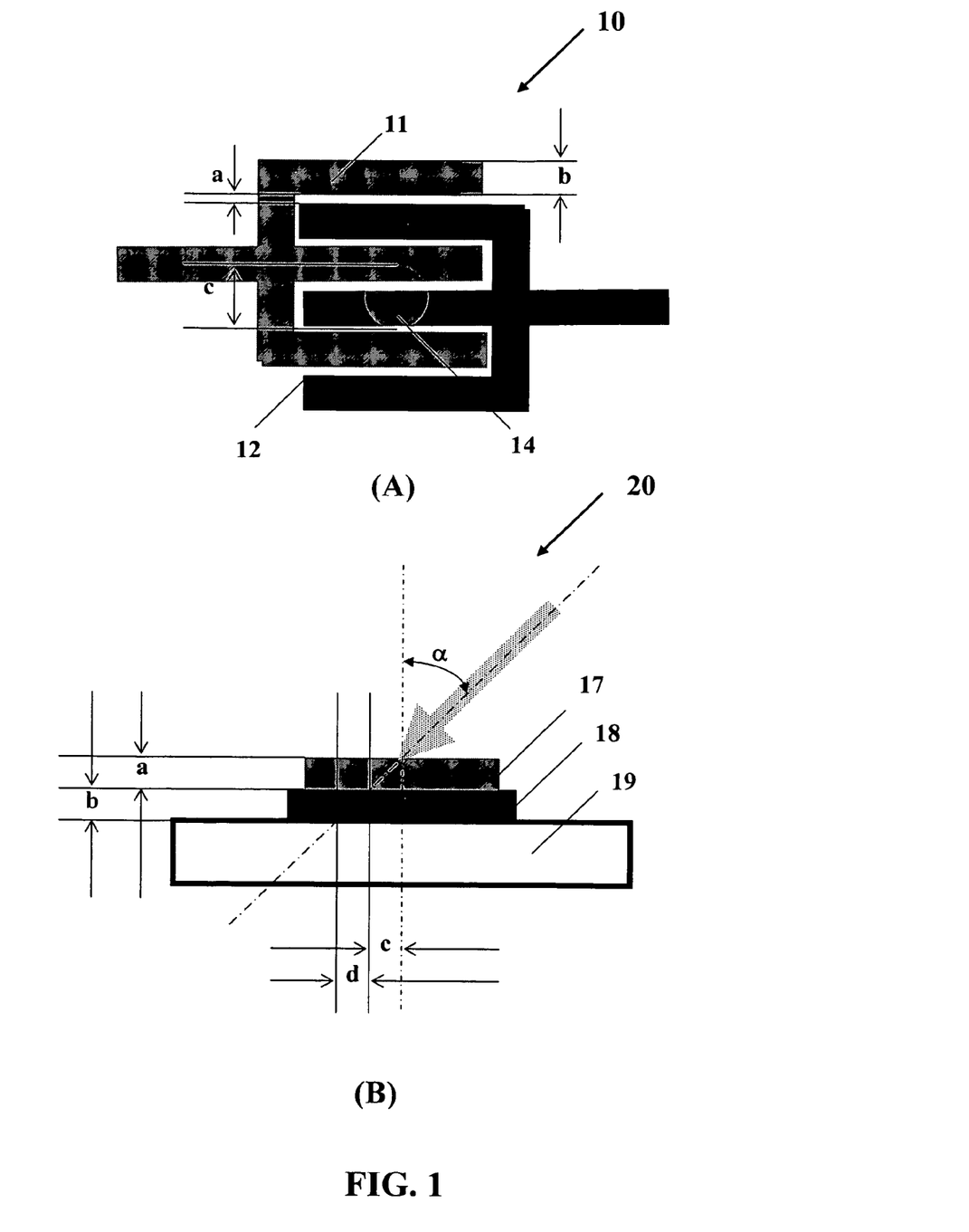
FIG. 1A shows the top view of an interlaced active area layout for the device of this invention.
FIG. 1B shows a side view of a stacked active area layout for the device of this invention.

FIG. 1A shows layers 10 of a photodetector having two active semiconductor layers 11 and 12 in a "side-by-side" or "interlaced" layout formed on a substrate. One of the areas is sensitive in UV and the other is sensitive to IR radiation. In order to satisfy the second basic requirement, the distance (a) between the neighboring interlacing active area features should be much smaller than at least one of either of the feature dimensions (b), and this dimension (b) plus the distance between the neighboring features (b+a) should be smaller than the diameter c of incident radiation spot 14. In this case incident radiation spot 14 made by radiation passing through an aperture will always at least partially cover both UV- and IR-sensitive active area features. In order to satisfy the third basic requirement, both of the UV- and IR-sensitive structures have to be intrinsically solar- or visible-blind or a filter must prevent detection of other radiation. The fourth basic requirement will be satisfied by providing individual electrical addressing to active areas of each of the photosensitive structures.

FIG. 1B shows "stacked" layout 20 with UV-sensitive structure 17 and IR-sensitive structure 18 on single substrate 19. The centers of both active areas are preferably vertically aligned. In this layout UV/IR radiation impinges at an incident angle $\alpha$, generating practically simultaneous (considering small thickness of the layers and high speed of light) signals in active areas 17 and 18. In order to satisfy the third basic requirement as in the previous case the active areas have to be intrinsically solar-or/and visible-blind. The fourth basic requirement can be satisfied by adjusting the ratios between the active areas thicknesses (a and b), their linear dimensions (b and c), and the radiation incident angle $\alpha$. This adjustment should also take into the account the refraction of the optical radiation caused by each of the materials in the stack.

The layouts described herein are shown for a monolithic photodetector having a signal pixel. However, each of the layouts can be implemented in a multi-pixel (array) design. Such designs are necessary in order to enable space sensitive light measurements (e.g. imaging). In this case the geometry of the staked layers and the substrate should satisfy conditions that provide for minimum cross-talk between the neighboring pixels.

The intrinsic solar- or visible blindness can be provided by employment of wide band gap semiconductor materials ($E_g > 3.1$ eV) for the formation of the UV-sensitive photodetector structures. The IR-sensitive photodetector structures normally have a broad spectral sensitivity extending into the visible range of the spectrum. Intrinsic solar- or visible blindness for such devices normally is achieved by employment of sophisticated multi-layer structures that intrinsically incorporate multi-quantum wells, Bragg reflectors, or interference filters. While fabrication of such devices is complicated and time- and cost-consuming, they are the only alternative for the visible- or solar-blind detection of IR radiation in the interlaced layout shown in FIG. 1A.

Figure 2:
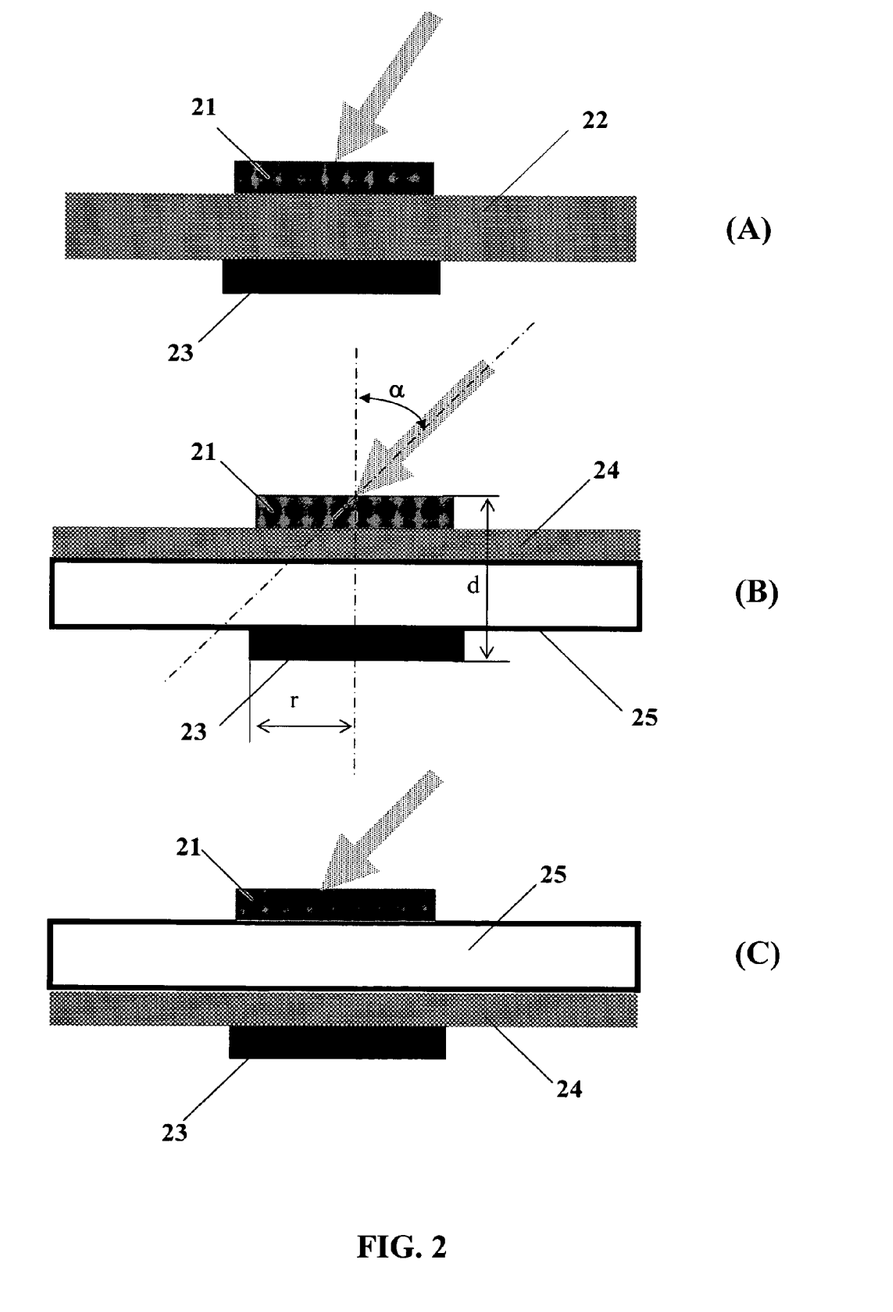
FIG. 2A illustrates the use of the substrate as a filter layer.
FIG. 2B illustrates a filter layer between an optically transparent substrate and a UV sensitive active area.
FIG. 2C illustrates a filter layer between an optically transparent substrate and IR sensitive active area

FIG. 2 shows layouts based on employment of a semiconductor material that exhibits intrinsic fundamental optical absorption in the solar or visible range of the spectrum and can be simply integrated into the design of a single chip monolithic dual-band UV/IR photodetector. FIG. 2A shows a layout that incorporates UV-sensitive layer 21 formed on the top of semiconductor substrate 22, which is also capable of filtering out solar or visible radiation, and IR-sensitive layer 23 formed on the bottom of the substrate-filter 22. FIG.

2B describes a layout that incorporates semiconductor layer 24 as a filter for the visible or solar radiation. Filter layer 24 will be formed between the surface of the photodetector exposed to incident light and the IR-sensitive active area 23, but it may be contiguous with either surface of transparent substrate 25, as illustrated in FIG. 2B and 2C. As shown in FIG. 2B, the third basic requirement can be satisfied through adjustments between the thickness of each layer and substrate, dimensions of the active areas, and the radiation incident angle. The thicker are the substrates and the layers, the smaller are the active areas, the smaller radiation incident angles can satisfy the third basic requirement. In general, the α incident angle can be roughly estimated from the following equation:

$$tg(\alpha)=r/d \quad \text{(Eq. 1)}$$

where α is the incident angle, r is the half dimension of the bottom active area and d is the total thickness of the whole photodetector structure.

In one embodiment of the single chip integrated dual-band (UV/IR) photodetector with resolved sensitivity in each band, a silicon substrate is used. Referring to the device layout shown in FIG. 2A, two photosensitive structures—one sensitive in the UV part of the spectrum and another sensitive in the IR part of the spectrum—are formed on a III nitride-based material and silicon (Si), respectively. The substrate may be <111>Si, which is generally accepted as preferred orientation for III nitride material growth.

The general growth process for the III nitride growth by, for example Radio Frequency Molecular Beam Epitaxy (RF MBE) is as follows: prior to growth the substrates are cleaned by standard solvent degreasing, acid etching, and a DI water rinse. They are then quickly loaded into the introduction chamber attached to the MBE chamber, pumped down below $1 \times 10^{-6}$ torr, and then transferred into the MBE chamber. Before initiating film deposition, the substrates are degassed at 850° C. and then the temperature is lowered to the growth temperature, typically between 750-825° C. for GaN, AlN, and AlGaN and 500-650° C. for InGaN and InN. AlN buffer layers are deposited at a high (>800° C.) temperature on both $Al_2O_3$ (sapphire) and Si substrates before deposition of GaN or/and its alloys.

Following deposition, the III nitride layer structure is patterned in order to form the UV-sensitive photodetector structure. The III nitride layer structure consists of a GaN or AlGaN layer (each of >200 Å thickness). The IR-sensitive photodetector structure is formed directly on the Si surface exposed after III nitride layer patterning. The patterning of the III nitride layer is carried out either after the growth by using photolithography and dry etching, or by a lift-off technique that uses deposition of a reverse patterned sacrificial layer (for example silicon dioxide) and its removal by wet etching after the III nitride structure growth. The patterns of both the UV-sensitive and the IR-sensitive structures should provide for "interlacing" between them. The interlacing geometry will generally determine the photodetector's spatial resolution. The interlacing can be accomplished by using, for example, a "comb-like" configuration schematically shown in FIG. 1A with the maximally possible number of lines and minimally possible distances between them per unit photodetector active area.

Both UV-sensitive and IR-sensitive photodetector structures can be either photoconductors or photodiode-type. In the case of photoconductors as photodetector structures, ohmic contacts should be deposited at each end of the "comb-like" area. In the case of photodiodes as photosensitive structures, active and ohmic contacts should be deposited on the "comb-like" areas. The active contacts should be transparent to the respective wavelengths (UV or IR) and can be made of thin (<200 Å) metal (Au is preferred because of the lowest resistivity) layers or conductive metal oxide semiconductor films ($SnO_2$ or ITO) deposited on p-n junctions, p-i-n juctions, or Schottky barriers. The ohmic contacts should be made of metals that have a large work function if deposited on p-type semiconductor layers, and small work function if deposited on n-type semiconductor layers, or any other metals or their combinations generally accepted for ohmic contacts to Si and III nitrides.

In the interlaced layout, the UV- and IR-sensitive photodetector structures may be electrically insulated from each other by an undoped AlN buffer layer grown on the silicon prior to the growth of the doped active III nitride layers (e.g. GaN or AlGaN ), in order to avoid formation of an undesirable silicon nitride layer, and provide for differential sensing.

A similar silicon substrate is used in the embodiment to realize the layouts shown in FIG. 2A. In this case the UV- and IR-sensitive photodetector structures are formed on the front and on the back of the Si substrate, respectively. The UV-sensitive structure is formed from the III nitride layer structure grown and patterned on the front of Si by methods described for the previous layout. Then an IR-sensitive photodetector structure with an active area coaxial with the active area of the UV-;sensitive photodetector structure is formed on the backside of the Si substrate by methods also described for the previous layout. In this layout a round (or at least square) shape for the active areas is preferred, since it provides for most efficient and uniform transfer of the electrical charge generated or being controlled on the photodetector structure contacts.

Figure 3:
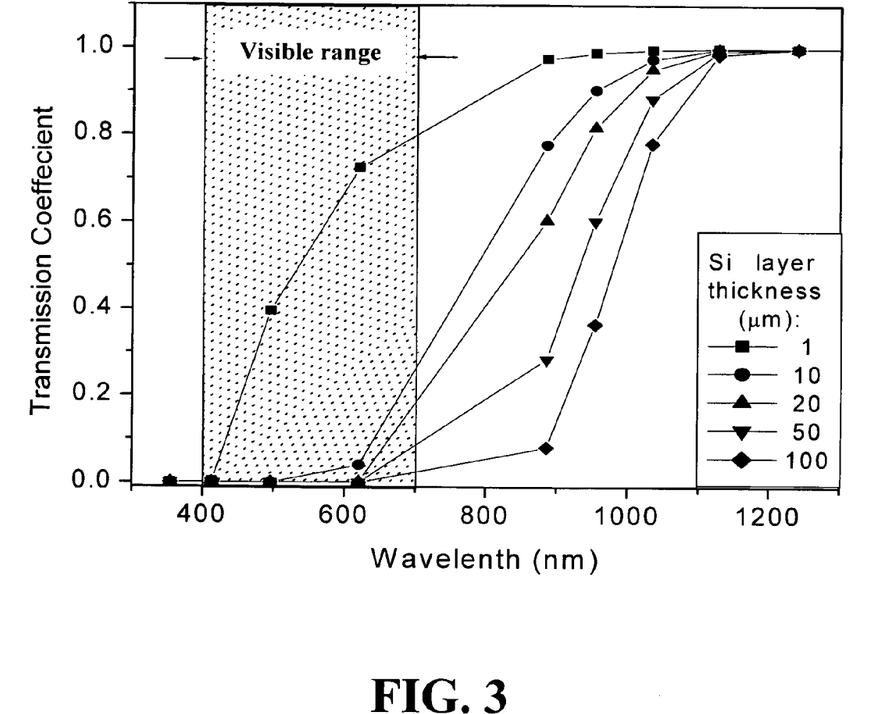
FIG. 3 shows the wavelength dependence of optical transmission of silicon layers having different thicknesses.

In this layout the Si substrate may serve as a filter blocking the solar- or visible radiation. The plots in FIG. 3 show the wavelength-dependence of the absorption coefficient for five different values of the silicon layer thickness. From the plots it can be seen that 10 μm and 20 μm thick Si layers transmit less than 30% and 20% of radiation, respectively, at a wavelength of 700 nm, which is generally accepted as a short pass cutoff for visible radiation. A 100 μm thick Si layer transmits less than 5% of the radiation at 700 nm and less than 10% of radiation at 900 nm. Depending on the photodetector application, employment of thinner (10-20 μm), or thicker (100-200 μm) Si layers can be beneficial.

Figure 4:
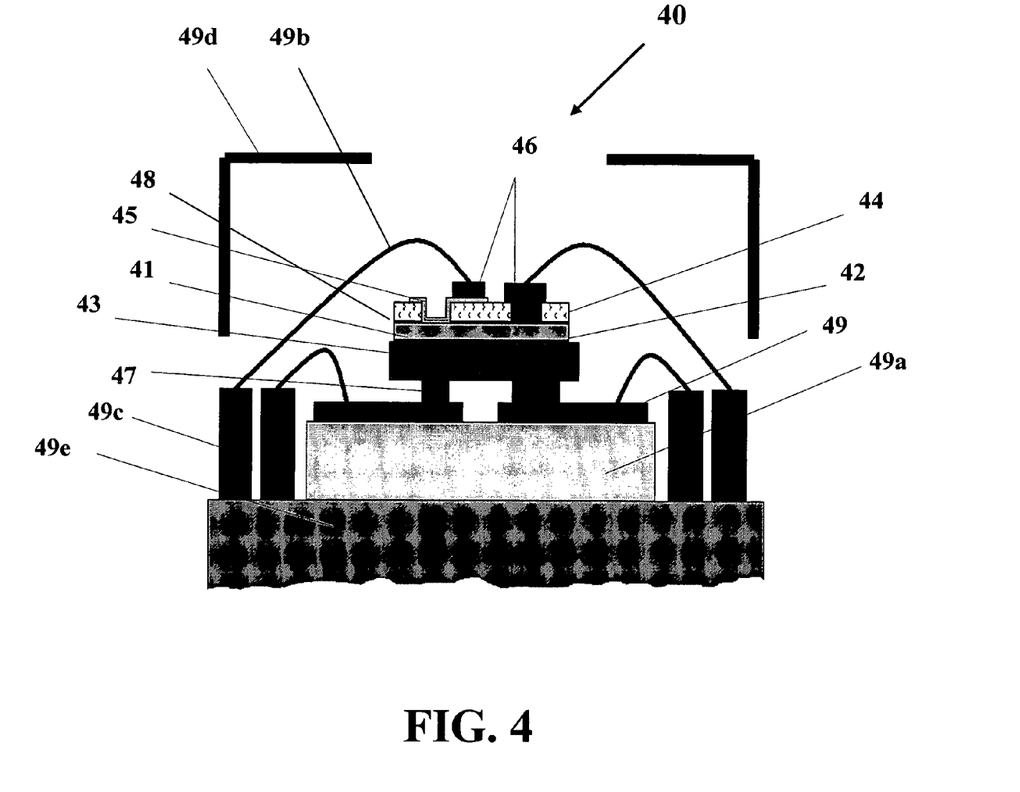
FIG. 4 is a schematic drawing of the single chip monolithic dual band UV/IR photodetector realized by using the first embodiment

The layout illustrated in FIG. 2A was realized in a device schematically shown in FIG. 4. Packaged monolithic photodetector 40 includes thick intrinsically n-type GaN layer 41 deposited on top of a buffer AlN layer 42 grown on n-type <111>Si wafer 43 having a thickness of 150 μm. In this device, a GaN layer was used to provide the UV sensitivity in the range below 365 nm. A ~2 μm thick silicon dioxide dielectric layer 44 was deposited and patterned in order to prevent leakage by using areas of exposed GaN surrounded by an insulating layer. Semitransparent (<100 Å thick) Au layer 45 was deposited through a stencil mask with ~1 mm diameter windows in such a way that half of the semitransparent gold contact area is located on the exposed GaN areas, while the other half is located on top of silicon dioxide insulating layer 44. Thick Ti (2000 Å)/Au (2000 Å) contacts 46 were then deposited on top of the semitransparent Au contacts located on the silicon dioxide layer and as ohmic contacts to GaN. The device was further processed by depositing Pt contacts 47 on n-type silicon on the backside of wafer 43 and a thin (~50 Å) silicon dioxide layer 48 in order to promote higher potential barrier height on the GaN. A standard TO-8 housing was used for packaging. Pt contacts 47 on the backside of the silicon chip were bonded by using the high-temperature conductive epoxy to Au pads 49 deposited and patterned on top of thermally-conductive electrically insulating AlN ceramic carrier plate 49a. Then the Au pads on the ceramic plate were micro-bonded by using a 30-μm thick Au wire 49b, with two of the TO-8 housing legs 49c, while the Ti/Au contacts on top of the chip were micro-bonded to the other two legs of the housing. A~5 mm diameter opening was cut in the housing cap 49d. This cap was glued by a high-temperature epoxy to the housing base 49e.

Similar packaging procedures can be used for assembly of monolithic dual band photodetectors based on other layouts described herein.

Figure 5:
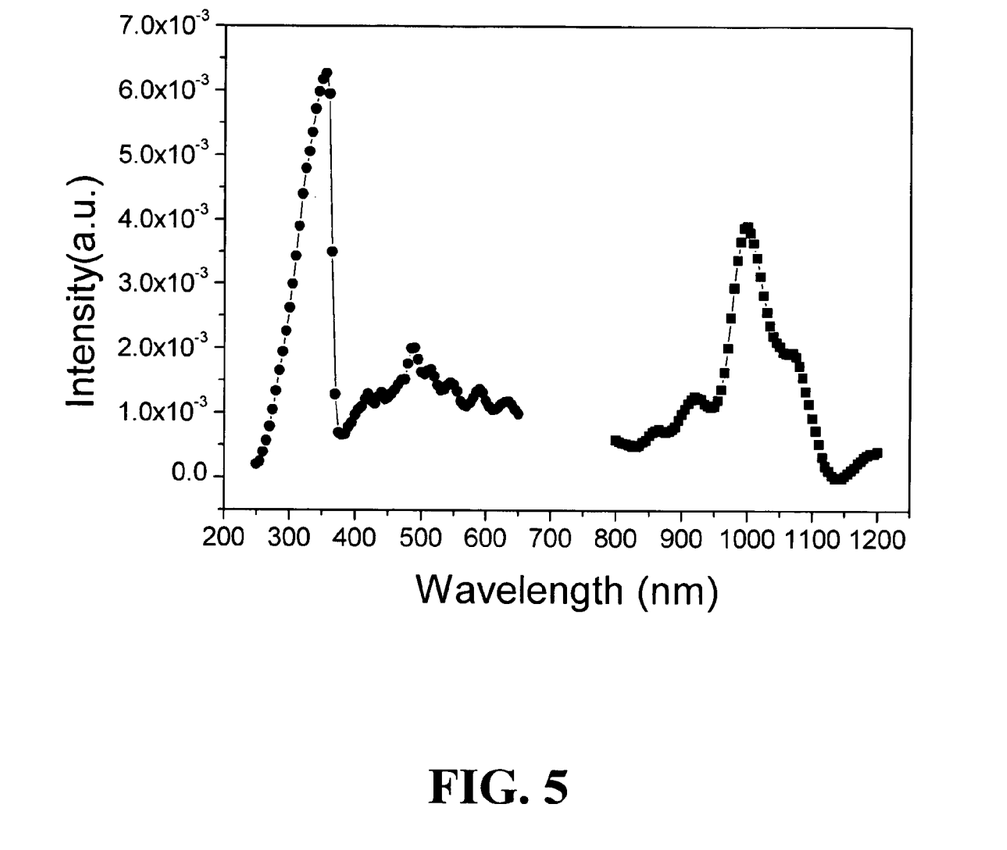
FIG. 5 shows the spectral response in arbitrary units of intensity measured from the photodetector shown in FIG. 4.

The device responsivity measured in two different bands from the single-chip-integrated dual-band photodiode illustrated in FIG. 4 is shown in FIG. 5. The maximum peaks at ~350 nm and ~960 nm, correspond to the band edge absorption of GaN and Si, providing a visible-blind sensitivity in the near UV and near IR range, respectively.

Employment of a AlGaN layer instead of the GaN layer can result in achievement of sensitivities in the UV range with a short pass cutoff wavelength in the range from 200 to 365 nm (depending on the Al content) and the device can be made solar-blind instead of visible-blind only.

A similar device layout can be used with a metal silicide layer formed on the backside of Si. The use of silicides takes advantage of silicon-based low cost technology and the abundant availability of silicon-based materials. Silicon detectors are widely used in a number of applications, however they lack optical integration due to the indirect nature of the silicon band gap. Improvements to Si have been achieved through integration with semiconducting suicides, such as: $ReSi_2$ ($E_g$=0.12 eV), $CrSi_2$ ($E_g$=0.3 eV) and β-$FeSi_2$ ($E_g$=0.87eV), of which β-$FeSi_2$ has a direct band gap energy that corresponds to a wavelength of 1.41 μm.

Figure 6:
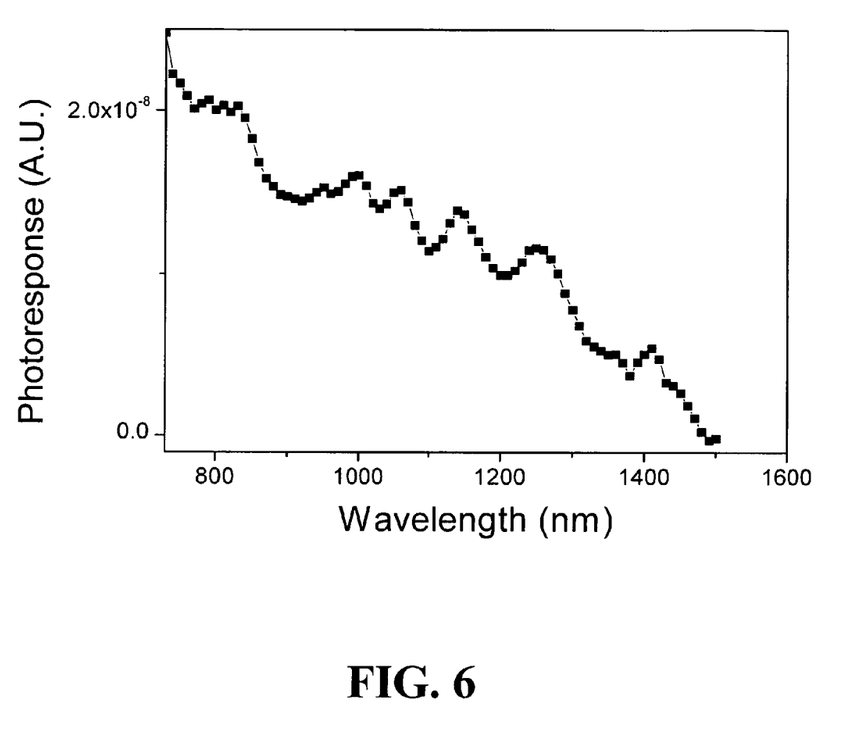
FIG. 6 shows the IR spectral response as a function of wavelength for a Pt-silicide Schottky barrier photodetector.

These PtSi/p-Si Schottky detectors have a barrier potential of 220 meV, which potentially offers a photodetection in the range from 3μm to 5 μm. Titanium silicides have also been shown to extend the photoresponse into the 1450 nm of the IR region. Pt-silicide Shottky barrier photodiodes are formed by vacuum deposition and patterning of Pt on Si wafers followed by thermal annealing of the structure under high vacuum conditions. FIG. 6 shows the photoresponse from a Pt-silicide Schottky barrier diode, which extends up to 1450 nm (versus 1100 nm in the case of Si).

The same device layout employing a silicon substrate as a filter for the visible or solar radiation can be used when III nitride layer structures are grown on both sides of a Si wafer. In this case the top III nitride layer structure contains an AlN buffer layer and a GaN or AlGaN layer as in the previously described layouts. This structure is used to form the UV-sensitive part of the integrated photodetector. The bottom III nitride layer structure contains an AlN buffer layer and an InN or an InGaN layer and is used to form the IR-sensitive part of the integrated photodetector.

Since the nitride layers are deposited on both sides of the silicon substrate, which in the case of RF MBE is radiatively heated, it is necessary to protect the films on the first side of the wafer during deposition on the second side. This can be done in two steps. The first step will be to deposit the more thermally stable AlN and AlGaN layers for the UV detection side before the InGaN or InN -based detection side. The second step will be to coat the finished UV side with $SiO_2$ or SiN, to prevent decomposition of the AlGaN during vacuum heating.

Another embodiment of the single chip integrated dual-band (UV/IR) photodetector with resolved sensitivity in each band is based on employment of a silicon-on-sapphire (SOS) substrate for the single-chip integration. By using the device layout shown in FIG. 2B, two photosensitive structures, one sensitive in the UV part of the spectrum the other sensitive in the IR part of the spectrum are formed on a III nitride based material and silicon, respectively grown on both sides of a SOS. Sapphire with a c-plane orientation is generally preferred for high quality III nitride layer growth. However, r-plane sapphire is used for commercial fabrication of the SOS substrates.

The main advantage of r-plane sapphire is the ability to grow III-Nitride films without a polar growth surface. The polar nature of the (0001)-oriented nitride surfaces can affect GaN/AlGaN quantum well emission (due to piezoelectric charge build up at the interfaces between GaN and AlGaN) and also p-type doping with Mg. The main disadvantage of r-plane sapphire is that the film quality is in many cases lower than the one for a comparable film grown on c-plane sapphire. The results so far on GaN growth on r-plane sapphire have shown reasonable surface quality as evidenced by streaky 2-dimensional RHEED patterns, but there may still be some structural quality issues. For example, the Si-doping behavior of these layers has been significantly different than for c-plane growths.

When r-plane sapphire is used as a substrate, a single crystalline Si <111>layer (which is also compatible with the III nitride layer growth), is grown on top of it (silicon-on-sapphire substrates are commercially available). As shown in the layout in FIG. 2B, a III nitride layer structure composed of an AlN buffer layer and GaN or AlGaN layer (as described in previous embodiment) is grown on the top of it by, for example, RF MBE. Then photolithography and dry etching are applied to the III nitride and Si layers to achieve the desired UV-photosensitive structure pattern. After this a III nitride layer structure composed of GaN buffer layer and InGaN or InN (as described in the previous embodiment) is grown on the backside of the r-plane sapphire. This III nitride layer structure is patterned by using photolithography and dry etching to form the IR-sensitive photodetector structure.

In the layout shown in FIG. 2C a similar SOS substrate is used, but it is flipped to accomplish the growth of the III nitride layer structure for the UV-sensitive part directly on r-plane sapphire, by deposition of GaN or AlGaN. The IR-sensitive part is formed on the backside either by using silicon as an active layer by formation of a photodetector (photoconductor, p-n junction, p-i-n junction, or Schottky barrier), or for the growth of a second III nitride layer structure composed of an AlN buffer layer, InGaN or InN, as described in the first embodiment.

Besides the possible advantages for the III nitride growth mentioned above, employment of SOS substrates for single-chip integration of the UV/IR dual-band photodetector results in additional benefits, such as: a) the UV- and IR-sensitive structures are perfectly electrically insulated from each other by the insulating sapphire substrate, which will provide for their time-resolved operation; b) the thickness of the silicon layer is simple to optimize (for example chosen in the range from 10 to 20 μm) to provide for both blocking of the visible or solar radiation and higher (than in the case of using thicker Si substrates) efficiency transmission of the IR radiation.

Another embodiment can be based on cubic silicon carbide (β-SiC) layers grown on silicon wafers. In this case the UV-only sensitive structure can be formed on the SiC layer that has a band gap of around 3 eV and provides absorption of radiation at wavelengths in the range below ~413 nm. The IR-sensitive structure can be formed on the backside of the silicon substrate as in previous embodiments.

Another embodiment can employ a layer of germanium or one of the group II-VI materials grown on the backside of silicon. In this case the UV sensitive structure will be formed either on the III-nitride or SiC layer grown on the front side of Si, and the IR-sensitive structure will be formed on the germanium or group II-VI layer grown on the backside of Si.

Other embodiments can use substrates known to be compatible with III-nitride deposition such as ZnO.

In the first two above embodiments the silicon wafer serves as a filter to block the visible or solar radiation.

Table 1 shows features and benefits for the single-chip integration of the photodetector with resolved sensitivities separately in UV and IR bands, resulting from application of each material described in the above embodiments.

TABLE I

Features and benefits of the disclosed chip provided by employment of different materials

| Material | Features and Benefits |
| --- | --- |
| Si substrates | Compatibility with conventional Si technology<br>Solar - or visible blindness<br>Si- and silicide-based detection of the IR radiation (up to ~1110 and ~1450 nm, respectively) |
| SOS substrates | Polar-free III nitride growth<br>More efficient IR radiation transmission<br>Better insulation between the UV- and IR-sensitive structures |
| SiC | Visible-blind (down from ~413 nm) UV sensing |
| GaN | Visible-blind (down from ~365 nm) UV sensing<br>Simpler and higher quality growth |
| AlGaN | Solar-blind (down from ~280 nm) UV sensing |
| InGaN or InN | High-temperature operation<br>Extended (up to ~1770 nm) IR sensing |
| Ge or II-VI layers on Si | Extended (up to ~1880 nm and up to ~8000 nm, respectively) IR sensing |

What we claim is:

1. A monolithic single chip solid-state visible- or solar-blind photodetector for sensing of optical radiation separately in UV and IR bands, comprising:
   a substrate suitable for growth of selected semiconducting layers;
   a first active semiconductor layer on the substrate having a sensitivity in the ultraviolet (UV) range only and a first pair of contacts to produce a first signal;
   a second active semiconductor layer on the substrate having a selective sensitivity in the infrared (IR) range and a second pair of contacts to produce a second signal, the first and second semiconductor layers being interlaced on the substrate and electrically insulated.

2. The photodetector of claim 1 wherein the selective Sensitivity in the infrared (IR) range is achieved by multilayer structures.

3. The multilayer structures of claim 2 wherein the structures consist of multi-quantum well, Bragg reflectors or interference filters.

4. The photodetector of claim 1 wherein the sensitivity to the optical radiation in the UV or IR bands is provided by a diode junction fabricated on one of the active semiconductor layers.

5. The photodetector of claim 1 wherein the sensitivity to the optical radiation in the UV and IR bands is provided by a photoresistor junction fabricated on one of the active semiconductor layers.

6. The photodetector of claim 1 wherein the substrate is selected from the group of substances compatible with the growth of the active semiconductor layers.

7. The photodetector of claim 1 wherein the substrate is silicon (Si), silicon carbide (SiC), or sapphire.

8. The photodetector of claim 1 wherein the active layer providing absorption of the radiaiion in the UV range only is selected from the group III-V nitride compounds or SiC.

* * * * *